United States Patent
Usoskin et al.

(10) Patent No.: US 10,538,840 B2
(45) Date of Patent: Jan. 21, 2020

(54) METHOD FOR FILM DEPOSITION AND APPARATUS FOR PERFORMING SAID METHOD

(71) Applicant: Bruker HTS GmbH, Hanau (DE)

(72) Inventors: Alexander Usoskin, Hanau (DE); Thomas Schneider, Frankfurt am Main (DE)

(73) Assignee: BRUKER HTS GMBH, Hanau (DE)

(*) Notice: Subject to any disclaimer, the term of this patent is extended or adjusted under 35 U.S.C. 154(b) by 0 days.

(21) Appl. No.: 15/703,016

(22) Filed: Sep. 13, 2017

(65) Prior Publication Data
US 2018/0073126 A1 Mar. 15, 2018

(30) Foreign Application Priority Data
Sep. 13, 2016 (EP) .................... 16188465

(51) Int. Cl.
*C23C 14/22* (2006.01)
*C23C 14/28* (2006.01)
*C23C 14/54* (2006.01)
*C23C 14/56* (2006.01)

(52) U.S. Cl.
CPC ............ *C23C 14/22* (2013.01); *C23C 14/541* (2013.01)

(58) Field of Classification Search
CPC ....... C23C 14/22; C23C 14/28; C23C 14/541; C23C 14/562
See application file for complete search history.

(56) References Cited

U.S. PATENT DOCUMENTS

| 5,405,659 A * | 4/1995 | Fernandez ............. C23C 14/28 118/50.1 |
| 5,622,567 A * | 4/1997 | Kojima ................ C23C 14/022 118/726 |
| 6,506,439 B1 | 1/2003 | Usoskin et al. |

(Continued)

FOREIGN PATENT DOCUMENTS

| DE | 1032411 B | 6/1958 |
| EP | 1104033 B1 | 5/2001 |

OTHER PUBLICATIONS

Ibi et al., Development of Long YBCO Coated Conductors by IBAD-PLD Method, Physica C, 445-448 (2006), pp. 525-528.

(Continued)

*Primary Examiner* — Michael P Wieczorek
(74) *Attorney, Agent, or Firm* — Edell, Shapiro & Finnan, LLC

(57) ABSTRACT

A method for depositing film on a substrate (16) through pulsed laser deposition, which includes: generating at least two pulsed laser beams (4, 5, 6) with at least one laser (1), and directing the at least two laser beams (4, 5, 6) to different target spots (9, 10, 11) of a target (12), whereby the target (12) is ablated and at least two plasma plumes (13) are created. The plasma plumes (13) create a flow of target material towards the substrate (16) and the target material is deposited onto the substrate (16) at a deposition area (24). The plasma plumes (13) created by the at least two laser beams (4, 5, 6) are spatially and temporally superimposed, and the target spots (9, 10, 11) are separated from each other at a distance that allows a gas-dynamical interaction of the created plasma plumes (13).

18 Claims, 5 Drawing Sheets

(56) References Cited

U.S. PATENT DOCUMENTS

| | | | |
|---|---|---|---|
| 7,736,438 B2 * | 6/2010 | Storer | C23C 14/0021 118/718 |
| 2005/0083578 A1 | 4/2005 | Usoskin | |
| 2016/0230265 A1 | 8/2016 | Darwish et al. | |

OTHER PUBLICATIONS

Sutoh et al., Formation of CeO2 Buffer Layer Using Multi-Plume PLD, Physica C 468 (2008), pp. 1594-1596.

Hanyu et al., Long-Length GdBCO Coated Conductors with IBAD/PLD Method, 8th European Conference on Applied Superconductivity (EUCAS 2007), IOP Publishing, Journal of Physics: Conference Series 97 (2008) 012273, pp. 1-6.

Nakayama et al., Influence of Initial Counter-Layer Deposition Condition Using Double-Plume PLD Method on Characteristics of Interface-Modified Josephson Junctions, Physica C 445-448 (2006), pp. 925-929.

Lackner, Industrially-Scaled Large-Area and High-Rate Tribological Coating by Pulsed Laser Deposition, Surface & Coatings Technology 200 (2005), pp. 1439-1444.

SRL and Fujikura Co. Ltd., Strategies Toward Low-Cost Coated Conductors in IBAD-MgO and PLD Method, CCA 2008 Houston, USA, Dec. 4-6, 2008, pp. 1-16.

* cited by examiner

METHOD FOR FILM DEPOSITION AND APPARATUS FOR PERFORMING SAID METHOD

CROSS REFERENCE TO RELATED APPLICATIONS

This application claims foreign priority under 35 U.S.C. § 119(a)-(d) to European Application No. 16188465.5 filed on Sep. 13, 2016, the entire contents of which are hereby incorporated by reference.

FIELD OF THE INVENTION

The invention concerns a method for depositing film on a substrate through pulsed laser deposition, the method comprising: generating at least two pulsed laser beams with at least one laser and directing the at least two laser beams to different target spots of a target, whereby the target is ablated and at least two plasma plumes are created, wherein the plasma plumes create a flow of target material towards the substrate and the target material is deposited onto the substrate at a deposition area.

Such a laser deposition method is for example disclosed in reference [1].

BACKGROUND

Pulsed laser deposition (PLD) is a method for depositing thin films on substrates by focusing a laser beam to a target of the material to be deposited. This target-material is ablated from the target in form of a plasma plume. By bringing the substrate into the vicinity of the plasma plume the target material is deposited as a thin film on the substrate.

PLD is used for example to produce HTS-layers for use in apparatuses using superconductivity (see references [1]-[6]). In order to improve the quality of the deposited film references [5] and [6] disclose methods for laser deposition wherein the pulsed laser beam is oscillated across the target to provide a substantially uniform coating with superconductive material on an elongate substrate. References [4] and [1] suggest a multi-path arrangement of the elongated substrate in order to enhance the yield.

References [1] and [2] disclose a multi-plume arrangement, i.e. several plasma plumes are directed to the target in sequence from different target spots, thus deposition rate can be improved without losing the required thickness homogeneity of the deposited film. Yet, only a moderate increase of deposition speed at high repetition rates (150-300 Hz) of laser pulses can be achieved, which is attributed to better removal of target material from a smoother target surface which is provided via the beam scanning the target surface.

SUMMARY

It is an object of the invention to increase processing throughput and to reduce in this way the processing costs.

According to one aspect of the invention, at least two plasma plumes created by N laser beams, with N>1, are spatially and temporally superimposed, and the target spots are separated from each other by a distance that allows a gas-dynamical interaction of the created plasma plumes.

Temporal superimposing is achieved by directing at least two laser beams to at least two target areas of the target concurrently. Spatial superimposing of the different plasma plumes can be achieved by choosing the distance between the target spots (i.e. the distance of the centers of the target spots) in dependence of the dimension of the plasma plumes. The positions of the target spots and the time lags of the at least two laser beams are chosen such that the plasma plumes caused by ablation of the target are superimposed (overlapped) temporally and spatially and gas dynamic interaction is initiated, i.e. kinetic energy is exchanged between ions, atoms and molecules in different material flows caused by plasma plumes. It was found that in presence of the gas dynamical interaction that is dependent on proximity of neighboring plumes the total material flow (as a sum of all N plasma plumes) unexpectedly increases the throughput of deposited material on the substrate beyond the factor N (=number of laser beams directed to the target). With the inventive method the throughput can be increased up to a factor of 2N to 3N (in contrast to an increase by a factor of N what one would expect to observe). It looks like that due to the gas dynamical interaction angular divergence of the total material flow is reduced. One reason for the reduction of the angular divergence is a suppression of deflection of ion/atom/molecular flows in presence of "multiple" superimposed plasma plumes.

The method may be employed in processing of multi-compositional films, in particular superconducting films as well as films for optical or electrical/electronical applications. For multi-compositional films a target of proper composition (i.e. with chemical composition that corresponds to the desired stoichiometry of the final film) is used. Alternatively, a multiple (matrix) target made of a plurality of "sub-targets" which have in average desired composition may also be employed. Interaction of plasma plumes originating from different targets may also be established.

Preferably the number of laser beams is from 2 to 20.

In a preferred variant of the inventive method the at least two laser beams are partial laser beams generated by splitting of a single laser beam. Only one laser is required then.

Preferably the single laser beam is split such that the partial laser beams have the same integral intensity.

Also preferred is a variant in which the single laser beam is split such that the partial laser beams have an equal cross section.

Alternatively the at least two laser beams are generated by different lasers. A beam splitting device can be omitted with this variant.

It is advantageous if at least two laser beams are synchronized such that the N plasma plumes are temporally and spatially superimposed for at least 30% of the life time of one of the plasma plumes, in particular of the plasma plume with the longer life time. The distance between the (center of) two neighboring target spots is chosen in the range of 0.01 to 0.3, in particular 0.02 to 0.2, of the length of one of the plasma plumes, in particular of the length of the longer plasma plume. "Length of the plasma plume" is the extension of the plasma plume perpendicular to the target surface with regard to the center of the corresponding target spot). The plasma plume is defined as a visible part of plasma which emits a light in wide spectral range (from violet to red). In more detailed consideration, the visible part of plasma plume is a result of motion of plasma from the target exposed to a laser pulse towards the substrate. Because of very quick motion of plasma (about 10 km/sec) the plasma plume is described by a shape which in reality is a stationary image of plasma travel. In a similar way, the width (or maximum diameter) of the plasma plume is defined. This distance between the target spots determines a degree of spatial overlapping of the plasma plumes. The distance to be chosen also depends on pulse energy (intensity times pulse duration), shape and dimensions of the target spots. Preferably the distance between the plasma plumes is not less than ¹/₁₀ of largest dimension of a spot (on the target) since the positive effect of the inventive method drops down otherwise.

Preferably the plasma plumes have the same life time.

Preferably the plasma plumes have the same length.

In a highly preferred variant the distance between the target spots is chosen less than 5 mm.

In order to realize a uniform ablation it is preferred to continuously and repeatedly move the target and the at least one laser generating the laser beams relative to one another.

Preferably a REBCO target is used.

When using a REBCO target the distance between the target spots is preferably in the range of 0.01 to 0.3 of the length of one of the plasma plumes created by the respective laser beam, in particular of the length of the longer plasma plume. The length of the laser plume is defined here as a plume length in visible part of optical spectrum emitted by plume plasma.

The material of each plasma plume is deposited at a sub-deposition area of the substrate, wherein the multitude of the sub-deposition areas forms the deposition area. It is preferred that the sub-deposition areas of two neighboring plasma plumes are superimposed at a degree of 5 to 99%, in particular at a degree of 10 to 85%.

It is preferred that the deposition area is moving with a linear speed of 0.2-2 m/s along a deposition window of a substrate heater during deposition.

This movement of the deposition area is preferably caused by superimposing of movements of the tape carrier, the target and the laser beams which are directed to the target. The laser beams are preferably scanned over the target with a scanning mirror. In addition it is preferred that the target is moved and/or rotated. Typically, the substrate is quickly moved during deposition, in particular at a speed of 0.2-3 m/s. The movement of the substrate can be linear and/or rotational. In PLD system where later motion is caused by substrate rotation, the substrate motion is perpendicular to the motion of the deposition area caused by laser beam scan. Because of such two-way motion a direction of resulting motion of the deposition zones is oriented (in coordinate system of the substrate) with a polar angle of 10-90 angular degrees relatively direction of laser beam scan. The resulting linear speed of the deposition zone relative to the substrate corresponds to $(V^2_{beam2}+V^2_{sub2})^{1/2}$ where $V_{beam}$ is a linear speed of the scan of laser beams and $V_{sub}$ is a linear speed of the motion of the deposition zones via substrate motion.

Another aspect of the invention concerns an apparatus for carrying out a method as described above, the apparatus comprising: a beam generating device for generating laser beams, a beam delivery system for directing laser beams to a target, a scan-device for relative movement between the laser beams and the target. According to this aspect of the invention, the beam delivery system comprises a beam splitter for splitting a single laser beam into the at least two laser beams. Thus the inventive apparatus is adapted for generating and directing at least two laser beams to different target spots of a target at the same time.

The scan device preferably comprises a substrate translation system for moving the substrate relative to the target. Alternatively or in addition, the scan device may comprise deflection mirrors and/or target drives for influencing (i.e. scanning or varying) the position of the target spots on the target.

Preferably a time delay device is provided in order to control the temporal offset of the laser beams and thereby the temporal overlap of the plasma plumes. This is in particular advantageous for compensation of temporal offsets of different laser beams for equalizing of difference in optical paths. It may also be desired to vary the temporal overlap of partial laser beams. Preferably the time delay device comprises deflection mirrors with variable distance which determines the time delay. Alternatively, the time delay device comprises one or more transparent solid plates or one or more cuvettes with liquid with different refractive index, such that different laser beams pass through materials of different refractive indexes.

Preferably the substrate is a tape helically wound up onto a tubular tape carrier. Thus long HTS-tapes can be processed.

In order to vary the location of the deposition area on the substrate it is preferred that the tape carrier is movable along and/or rotatable about its longitudinal axis.

In order to keep the substrate at a desired temperature it is preferred that a substrate heater is provided, in particular a tubular quasi-equilibrium heater, the latter enabling pulsed laser deposition of the HTS material.

Further advantages can be extracted from the description and the enclosed drawing. The features mentioned above and below can be used in accordance with the invention either individually or collectively in any combination. The embodiments mentioned are not to be understood as exhaustive enumeration but rather have exemplary character for the description of the invention.

BRIEF DESCRIPTION OF THE DRAWINGS

Various exemplary embodiments of the invention is shown in the drawing.

DETAILED DESCRIPTION

Figure 1A:
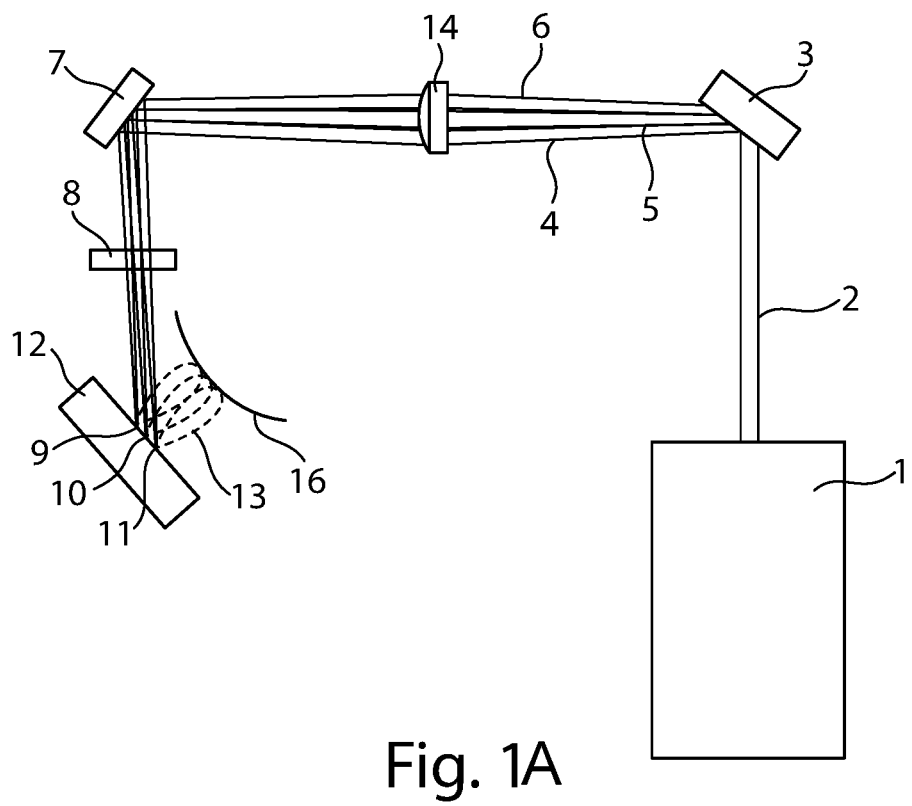
FIG. 1A shows a schematic representation of a first embodiment of an apparatus according to the invention comprising a beam splitter.

FIG. 1A shows a preferred embodiment of a deposition apparatus according to the present invention. The deposition apparatus comprises a beam generating device (laser 1) for generating an incoming laser beam 2. Further a beam delivery system is provided. In the shown embodiment the beam delivery system a beam splitter 3 which splits the incoming laser beam 2 into several (preferably equal) partial laser beams 4, 5, 6 and a imaging lens 14. The partial laser beams 4, 5, 6 are directed via a scan device (scan mirror 7) and a chamber window 8 of a deposition chamber (in particular a vacuum chamber) to different target spots 9, 10, 11 of a target 12, which is positioned within the deposition chamber. By impinging of the partial laser beams 4, 5, 6 onto the target 12, the target 12 is ablated and a set of plasma plumes 13 is generated which create a flow of target material from the target 12 to a substrate 16. The target material of the set of plasma plumes 13 is deposited onto the surface of the substrate 16 at a deposition area 24 (see FIG. 4B).

Figure 1B:
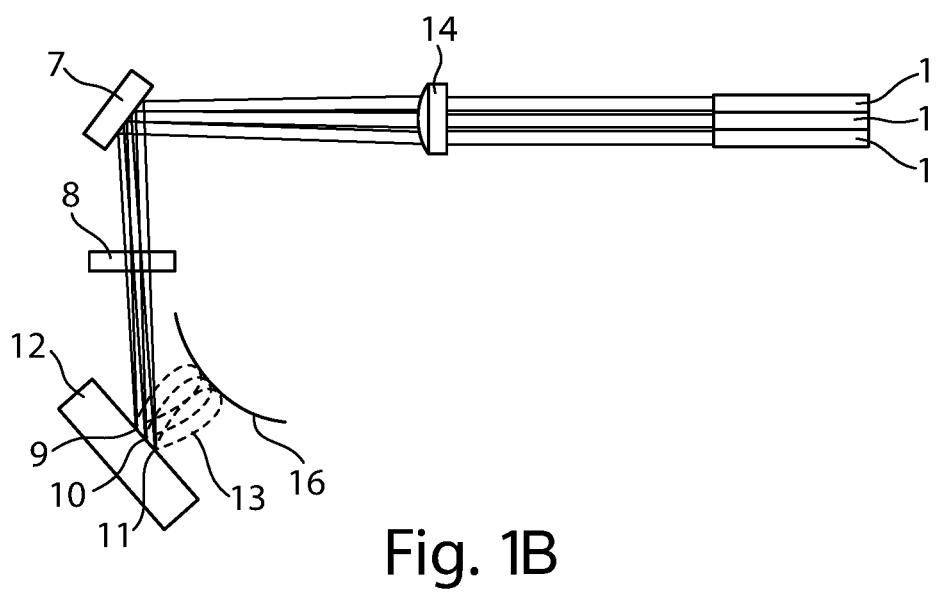
FIG. 1B shows a schematic representation of a second embodiment of an apparatus according to the invention comprising several lasers.
Figure 1C:
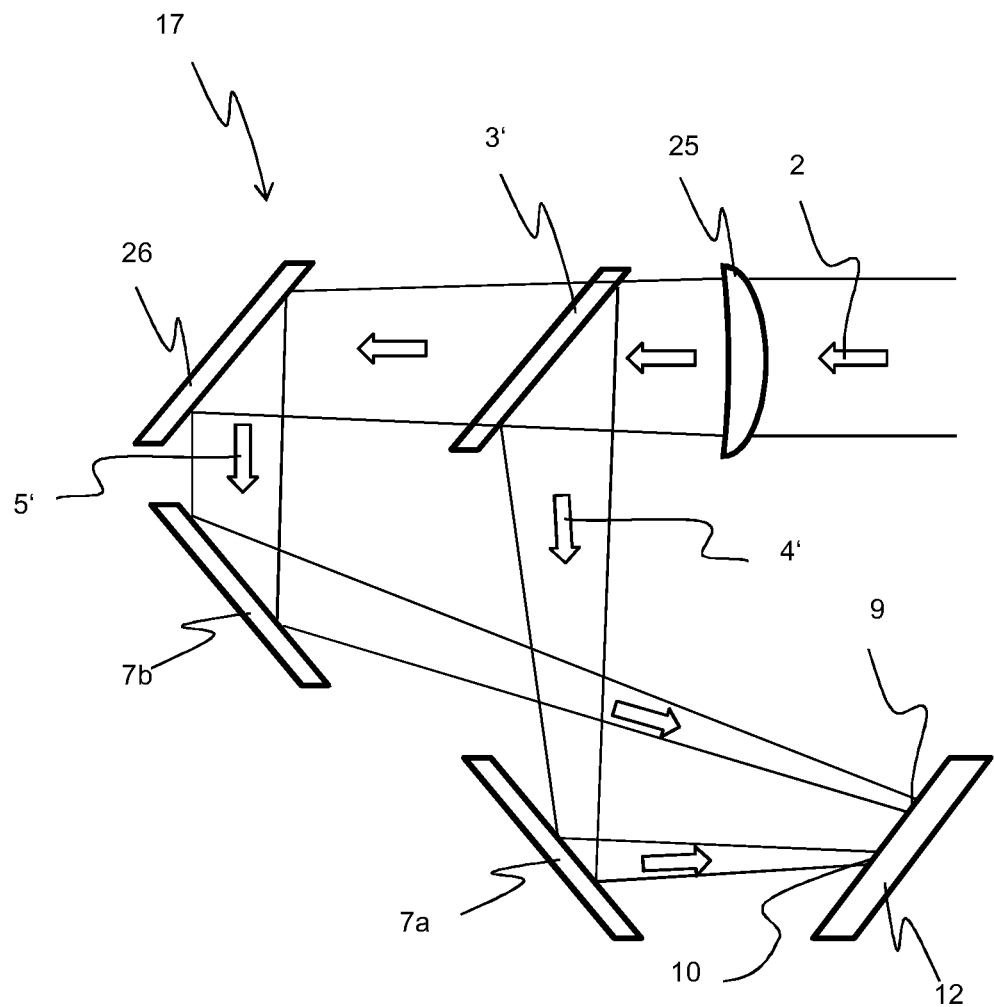
FIG. 1C shows an alternative beam splitter and a time delay device which can be used with an apparatus according to the invention.

FIG. 1C shows an alternative possibility to split the incoming laser beam 2 into several partial laser beams 4', 5' with an alternative beam splitter 3'. In contrast to the beam splitter 3 shown in FIG. 1A which splits the incoming laser beam 2 into partial laser beams 4, 5, 6 with a smaller cross-section compared to the incoming laser beam 2 while maintaining the intensity of the incoming laser beam 2, the alternative beam splitter 3' of FIG. 1C splits the incoming laser beam 2 into partial laser beams 4', 5' which show the same cross section as the incoming laser beam 2 but have a reduced intensity. This is achieved by using a semitransparent mirror, preferably with 50% reflection.

In a second embodiment several lasers 1 are used to generate the several laser beams 4, 5, 6 which are then directed to the target 12, as shown in FIG. 1B.

The (partial) laser beams 4, 5, 6, 4', 5' respectively can be guided through a time delay device 17 in order to direct them to the target with a predetermined temporal offset. This is exemplarily shown for partial laser beams 4', 5' in FIG. 1C: The incoming laser beam 2 passes a focusing lens 25 and is split by the semitransparent mirror 3' into the two partial laser beams 4', 5'. The partial laser beams 4', 5' are directed to target spots 9 and 10 on the surface of the target 12 with mirrors 26, 7a, 7b. In some cases an additional focusing lens is needed in the path of partial beam 4' in order to equalize difference of sizes of spots 9 and 10 on the target. Due to 50% reflection of the incoming laser beam 2 at mirror 3' resulting in partial laser beam 4' and 100% reflection of the partial laser beam 5' by mirror 26 the paths of the two partial laser beams 4', 5' are different. Because of that a differential time delay is introduced. When the differential time delay exceeds 1 ns two separate lenses are needed in order to image target spots of similar size for the different partial laser beams 4', 5'. Typically a geometrical difference of 0.3 m is needed to provide a differential delay of 1 ns.

Figure 2:
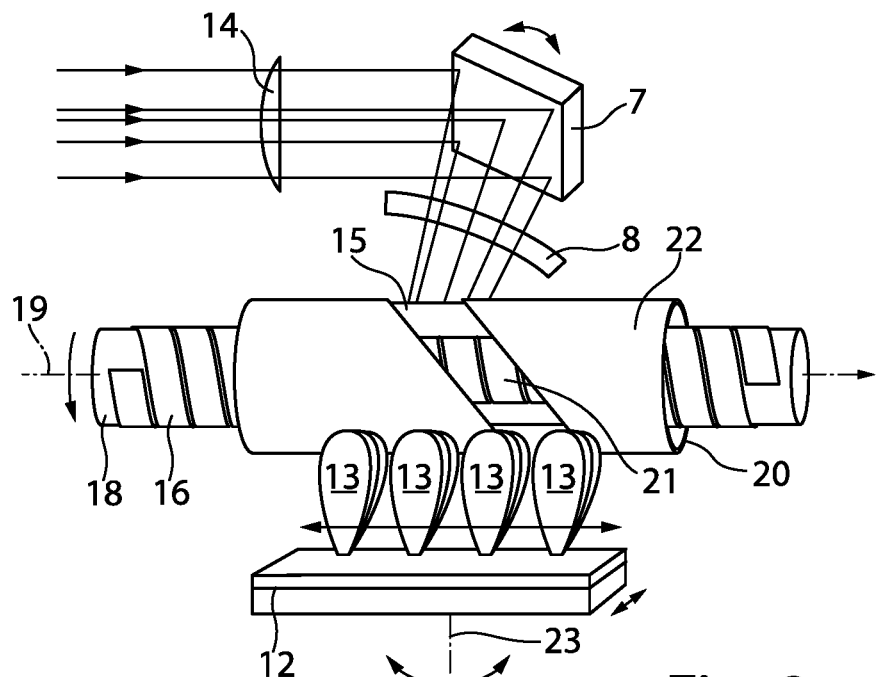
FIG. 2 shows a detailed 3-dimensional representation of the arrangement of target, substrate, and heater.
Figure 3:
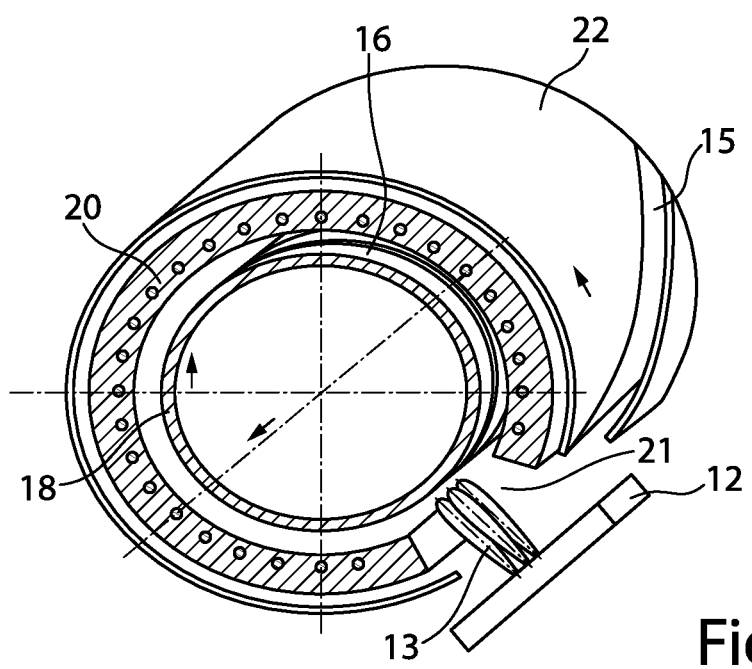
FIG. 3 shows a detailed 3-dimensional representation of the heater.

In FIG. 2 a preferred arrangement of the target 12 and the substrate 16 is shown. The substrate 16 is a tape fixed in a helix form wound up onto a cylindrical tape carrier 18. The tape carrier 18 is rotatable around the cylinder axis (rotation axis 19) of the tape carrier 18 and can be linearly moved along that rotation axis 19. The tape carrier 18 is positioned within a tubular heating element 20, for keeping the substrate 16 and the deposited target material at a desired temperature. The heating element is part of a quasi-equilibrium heater and comprises a deposition window 21. The heating element 20 is positioned co-axially relatively to the rotation axis 19 of the tape carrier 18. A rotating chopper 22 with a helical chopper slit 15 surrounds the heating element 20 thereby enabling a higher degree of temperature stabilization. A detailed representation of the heater is shown in FIG. 3.

The target 12 can be rotated around a further axis 23 and moved linearly perpendicular to the axis 23. Thus the laser beams impinge at different areas (sets of target spots) which results in an ablation of the target 12 at different areas of the target. In FIG. 2 for example four sets of plasma plumes 13 are indicated originating from four different sets of target spots.

Figure 4A:
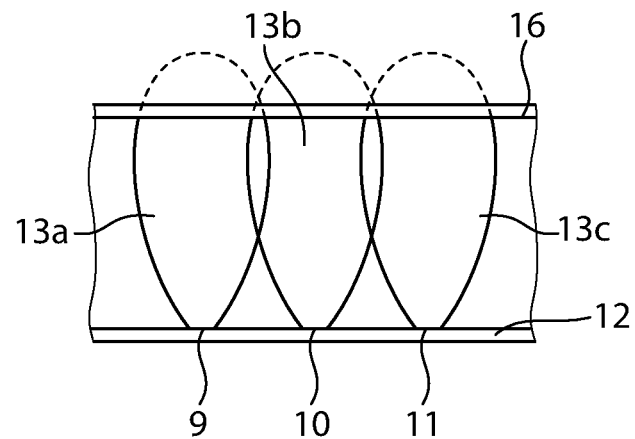
FIG. 4A shows three overlapped plasma plumes.
Figure 4B:
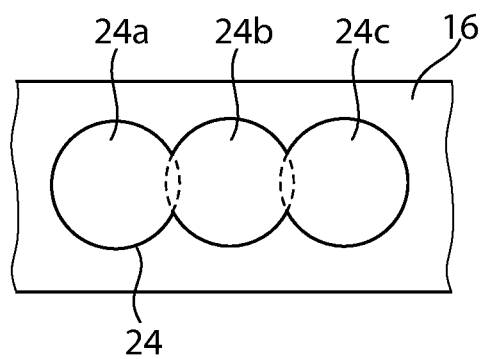
FIG. 4B shows the deposition area of the plasma plumes shown in FIG. 4A.

According to the invention the distance between the target spots 9, 10, 11 are chosen such that the resulting plasma plumes 13a, 13b, 13c are spatially superimposed as shown is FIG. 4A, such that that gas-dynamical interaction between neighboring plasma plumes is enabled. The target material of the plasma plumes 13a, 13b, 13c is deposited onto the substrate at different sub-deposition areas 24a, 24b, 24c the entirety of which is called deposition area 24. The deposition area 24 moves during deposition due to the movement of the substrate 16 and the scanning movement of the laser beams 4, 5, 6.

Figure 5:
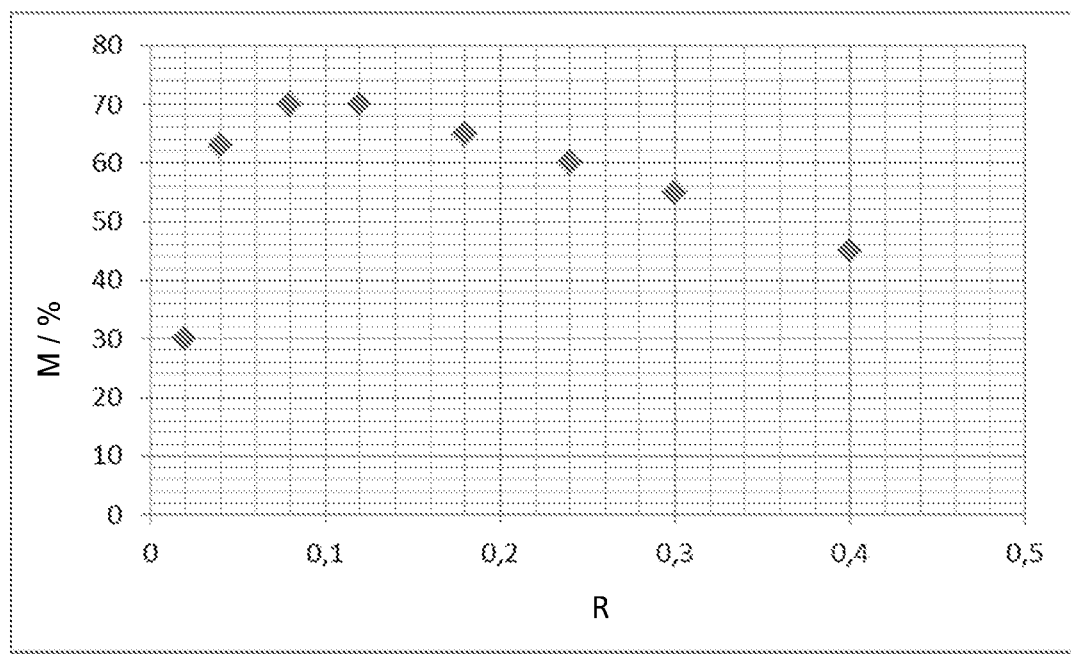
FIG. 5 shows a diagram of the material yield in dependence of the ratio of distance between the spots of the plasma plumes and the plume length.

FIG. 5 shows a diagram of the material yield M in dependence of the ratio R of distance between the spots of the plasma plumes and the plume length. It can be seen that with increased distance between target spots the material yield M start to increase as well, reaches a maximum, and then by larger distances that correspond of 0.5 of the length of laser plume, the material yield M start to drop down. Nevertheless, at some deposition conditions, when the beam spots on target are in millimeter range, the material yield is high enough still by R=0.01 (this curve is not shown in FIG. 5). That is why this limit is settled as lower level for R.

In an experiment the incoming laser beam 2 has been divided into two equal partial laser beams 4', 5' each of which has been focused at the surface of an $Y_1Ba_2Cu_3O_{7-\delta}$-target 12 in a way that the distance between the target spots 9, 10 was about 10-20% of the length of the resulting plasma plumes. In this case the splitting of the incoming laser beam 2 was provided by a reflection of the whole cross-section done by a dividing mirror having a reflection coefficient of 50% (because of low (<0.01%) absorption in the dielectric multi-layer interference mirror, the transmission coefficient was also about 50%) as shown in FIG. 1C. In the same manner the incoming beam 2 could be divided in three, four, five, . . . sub-beams each of which show an equal cross-section which is equal to the cross-section of the incoming laser beam. Naturally the reflection coefficients of the mirrors used for beam division should be of 33 and 50% in case of three sub-beams or 25%, 33%, 50% in case of four sub-beams and so on. The time shift between these two partial beams was less than 1 ns. Film deposition has been performed at low vacuum conditions with filling the processing chamber with oxygen having a partial pressure of 0.4 mbar. During deposition both target spots has been continuously and repeatedly moved across the target. Deposition has been achieved on a stainless steel tape substrate buffered with a bi-axially textured yttria-stabilized zirconia (YSZ) buffer layer. During deposition the substrate was heated up to 740° C., continuously moved (rotated together with the drum tape carrier) with a linear speed of ~1 m/sec in order to homogenize the temperature of the tape substrate as well as the stoichiometry and the thickness of the film. The processing speed was increased in this case by a factor of 4 while only a factor of 2 was expected (as a sum of inputs of two deposition zones).

According to the invention it has been recognized that processing throughput can be increased significantly if gas-dynamical interaction between the plasma plumes is allowed.

In another embodiment example, a planar beam splitter generating three beams of equal cross-section was employed (such beam splitter is described in [8], FIG. 6). The splitting optics was installed before the imaging lens 25 in a way that it generated three partial laser beams 4, 5, 6 of equal intensity superimposed in one beam cross-section. The origin of this three beams was the same single beam 2 of one laser. After splitting, the partial beams 4, 5, 6 had slightly different (by about 0.05 rad) angles against each other. This allowed to focus them at different spots 9, 10, 11 on the target similarly to FIG. 1A.

As a result of equivalent (to the first example) deposition tests the processing speed has been increased by a factor of 5.5 in case of proximity of three plasma-plumes (i.e. in case of gas-dynamic interaction) while a factor of only 3 was expected as simple sum that should occur without interaction of plumes.

LIST OF REFERENCE SIGNS 1 laser
2 incoming laser beam
3, 3' beam splitter
4, 4' partial laser beam
5, 5' partial laser beam
6 partial laser beam
7, 7a, 7b scan mirrors
8 chamber window
9 target spot
10 target spot
11 target spot
12 target
13 set of plasma plumes
13a, 13b, 13c plasma plumes
14 imaging lens
15 chopper slit
16 substrate
17 delay device
18 tape carrier
19 tubular axis of the tape carrier
20 heating element
21 deposition window
22 chopper
23 rotational axis of the target
24 deposition area
24a, 24b, 24c sub-deposition areas
25 mirror

LIST OF CITED REFERENCES

[1] A. Ibi et al, Physica C 445-448 (2006), p. 526-528
[2] Y. Sutoh et al, Physica C 468 (2008), p. 1594-1596
[3] S. Hanyo et al., Journal of Physics: Conference Series 97 (2008) 012273
[4] SRL and Fujikura Co. Ltd., "Strategies Toward Low-Cost Coated Conductors in MAD-MgO and PLD Method", CCA2008 Houston, USA
http://www.cca08.com/pdf/presentations/2C-10-YAMADA.pdf
[5] EP 1 104 033 B1
[6] U.S. Pat. No. 6,506,439 B1
[7] US 2005/0083578 A1
[8] DE 1 032 411 B3

What is claimed is:

1. Method for depositing film on a substrate through pulsed laser deposition, the method comprising:
generating N pulsed laser beams with at least one laser, with N>1;
directing the laser beams to different target spots of a target, whereby the target is ablated to create at least two plasma plumes,
wherein the plasma plumes create a flow of target material towards the substrate and the target material is deposited onto the substrate at a deposition area,
wherein the plasma plumes created by the laser beams are superimposed both spatially and temporally, and
wherein centers of the target spots are separated from each other by a distance that allows generation of a gas-dynamical interaction of the superimposed plasma plumes, wherein a total quantity of the target material deposited onto the substrate in the presence of the gas dynamical-interaction exceeds by a factor of up to three a total quantity of target material deposited onto the substrate when the plasma plumes do not generate a gas-dynamical interaction.

2. Method according to claim 1, wherein the laser beams are partial laser beams generated by splitting a single laser beam, and wherein each partial laser beam has a cross-section that is substantially equal to a cross-section of the single laser beam.

3. Method according to claim 2, wherein the single laser beam is split such that the partial laser beams have respective integral intensities that are at least approximately equal.

4. Method according to claim 1, wherein the laser beams are partial laser beams generated by splitting a single laser beam such that the partial laser beams have respective cross sections that are at least approximately equal to each other and are smaller than a cross section of the single laser beam.

5. Method according to claim 1, wherein the N laser beams are generated by respectively different lasers.

6. Method according to claim 5, wherein the N laser beams are synchronized such that the plasma plumes are temporally and spatially superimposed for at least 30% of one of the plasma plumes' life times.

7. Method according to claim 6, wherein the N laser beams are synchronized such that the plasma plumes are temporally and spatially superimposed for at least 30% of the life time of the plasma plume with a longest of the life times.

8. Method according to claim 1, wherein a distance between the target spots is selected from within a range of 0.01 to 0.3 of the length of one of the plasma plumes.

9. Method according to claim 8, wherein the distance between the target spots is selected from within the range of 0.01 to 0.3 of the length of a longest of the plasma plumes.

10. Method according to claim 1, wherein the distance between the target spots is less than 5 mm.

11. Method according to claim 1, wherein the target and the at least one laser generating the laser beams are continuously moved relative to one another during said generating.

12. Method according to claim 1, wherein the target is a REBCO target.

13. Method according to claim 12, wherein the distance between two neighboring ones of the target spots is selected from within a range of 0.01 to 0.1 of the length of one of the plasma plumes created by the laser beams.

14. Method according to claim 13, wherein the distance between the target spots is selected from within the range of 0.01 to 0.3 of the length of a longest of the plasma plumes.

15. Method according to claim 1, wherein a material of each plasma plume is deposited at a sub-deposition area of the substrate, wherein a union of the sub-deposition areas forms the deposition area, and wherein the sub-deposition areas of two neighboring ones of the plasma plumes are superimposed to a degree of 5 to 99%.

16. Method according to claim 15, wherein the two neighboring plasma plumes are superimposed to a degree of 10 to 85%.

17. Method according to claim 1, wherein, during the depositing, the deposition area moves with a linear speed of 0.2-2 m/s along a deposition window of a heating element.

18. Method according to claim 17, wherein the movement of the deposition area is caused by superimposing movements of a tape carrier, the target and the laser beams which are directed to the different target spots of the target.

\* \* \* \* \*